United States Patent
Ozeki et al.

(10) Patent No.: US 7,649,487 B2
(45) Date of Patent: Jan. 19, 2010

(54) A/D CONVERTER AND A/D CONVERSION METHOD

(75) Inventors: Toshiaki Ozeki, Osaka (JP); Daisuke Nomasaki, Osaka (JP); Koji Oka, Osaka (JP)

(73) Assignee: Panasonic Corporation, Osaka (JP)

( * ) Notice: Subject to any disclaimer, the term of this patent is extended or adjusted under 35 U.S.C. 154(b) by 425 days.

(21) Appl. No.: 11/631,844

(22) PCT Filed: Mar. 24, 2006

(86) PCT No.: PCT/JP2006/305935
§ 371 (c)(1),
(2), (4) Date: Jan. 8, 2007

(87) PCT Pub. No.: WO2007/032110
PCT Pub. Date: Mar. 22, 2007

(65) Prior Publication Data
US 2009/0040088 A1    Feb. 12, 2009

(30) Foreign Application Priority Data
Sep. 16, 2005 (JP) ............................ 2005-270172

(51) Int. Cl.
*H03M 1/38* (2006.01)
(52) U.S. Cl. ........................ 341/161; 341/155
(58) Field of Classification Search ............... 341/155, 341/161, 118, 120, 110
See application file for complete search history.

(56) References Cited

U.S. PATENT DOCUMENTS

| | | | | |
|---|---|---|---|---|
| 5,821,893 | A | * 10/1998 | Kumamoto et al. | ......... 341/161 |
| 7,154,427 | B2 | * 12/2006 | Matsui et al. | ............... 341/161 |
| 2002/0024363 | A1 | 2/2002 | Fujimoto | |
| 2004/0061637 | A1 | 4/2004 | Fujimoto | |

FOREIGN PATENT DOCUMENTS

JP   2002-74976 A   3/2002

OTHER PUBLICATIONS

Andrew M. Abo et al., "A 1.5-V, 10-bit, 14.3-MS/s CMOS Pipeline Analog-to-Digital Converter," IEEE Journal of Solid State Circuits, May 1999, pp. 599-606, vol. 34, No. 5.

* cited by examiner

*Primary Examiner*—Brian Young
(74) *Attorney, Agent, or Firm*—McDermott Will & Emery LLP

(57) ABSTRACT

In an A/D converter provided with an A/D converter circuit 101 for operationally amplifying an input signal and outputting an amplified signal, the A/D converter circuit 101 includes an initial value setting circuit 4a in addition to an amplifier 1a, a sub-A/D converter 2a, a sub-D/A converter 3a and capacitors C11 and C12. To ensure that the initial value of the output voltage of the amplifier 1a is a given voltage value close to the target value of operational amplification at the start of the operational amplification by the amplifier 1a, the initial value setting circuit 4a applies a given bias value equal to the given voltage value close to the target value to a next-stage capacitor C13 to be connected to the output side of the amplifier 1a. Such an A/D converter circuit 101 that can perform speedy convergence to the target value of operational amplification is used at each stage of a pipeline A/D converter.

8 Claims, 3 Drawing Sheets

A/D CONVERTER AND A/D CONVERSION METHOD

RELATED APPLICATIONS

This application is the U.S. National Phase under 35 U.S.C. §371 of International Application No. PCT/JP2006/305935, filed on Mar. 24, 2006, which in turn claims the benefit of Japanese Application No. 2005-270172, filed on Sep. 16, 2005, the disclosures of which Applications are incorporated by reference herein.

FIELD OF THE INVENTION

The present invention relates to an A/D converter and an A/D conversion method.

BACKGROUND ART

A pipeline type A/D converter includes a plurality of A/D converter circuits, and each of the A/D converter circuits bears a very important function. The power consumed by these A/D converter circuits occupies a large proportion of the entire power consumption. Such A/D converter circuits constituting a pipeline A/D converter are required to perform operational amplification operation including multiplication and addition/subtraction for an input signal.

As an exemplary configuration, such an A/D converter circuit includes a voltage comparator for comparing a supplied analog input voltage with a reference voltage, a voltage generator for generating a reference voltage used for addition/subtraction, an amplifier for operationally amplifying an input signal, and the like.

FIG. 6 shows a conventional A/D converter circuit as a component of a pipeline A/D converter. This conventional A/D converter circuit is described in Non-patent Literature 1. The A/D converter circuit 100 shown in FIG. 6 includes a sub-A/D converter 2a, a sub-D/A converter 3a, an amplifier 1a, a first capacitor C11, a second capacitor C12 and five switches SW1, SW2, SW3, SW4 and SW5.

The operation of the A/D converter circuit having the circuit configuration described above can be divided into two different periods: a sampling period and an amplification period. First, the sampling period during which an input signal is sampled will be described. In the sampling period, the switch SW1 is switched to position a (the side of input of an input signal VIN), two switches SW2 and SW5 are turned ON, and the remaining two switches SW3 and SW4 are turned OFF. In this state, the analog input signal VIN inputted via the input terminal is connected to the sub-A/D converter 2a and the first and second capacitors C11 and C12, but not connected to the output terminal of the amplifier 1a. Once the sampling period is terminated, the three switches SW1, SW2 and SW3 are turned OFF.

In the subsequent amplification period, the switch SW1 is switched to position b (the side of the sub-D/A converter 3a), two switches SW3 and SW4 are turned ON, and the remaining two switches SW2 and SW5 are turned OFF. In this state, the output terminal of the sub-D/A converter 3a is connected with the first capacitor C11, and the output terminal of the amplifier 1a is connected with the second capacitor C12. At this time, the non-inverting input terminal of the amplifier 1a is virtually grounded. Once the amplification period is terminated, the three switches SW1, SW3 and SW4 are turned OFF. These entire switch operations are performed synchronously.

More specifically, during the sampling period, the analog input signal VIN is applied to the first and second capacitors C11 and C12 to allow charge to be stored in these capacitors. Also, the sub-A/D converter 2a A/D-converts the analog input signal VIN based on a predetermined reference voltage. Subsequently, the sub-D/A converter 3a D/A-converts the digital input signal A/D-converted by the sub-A/D converter 2a, to determine a reference voltage used for addition/subtraction in the next amplification period.

In the subsequent amplification period, the output terminal of the sub-D/A converter 3a is connected with the first capacitor C11, and the output terminal of the amplifier 1a is connected with the second capacitor C12. During this time, since the non-inverting input terminal of the amplifier 1a is virtually grounded, charge corresponding to the reference voltage as the output of the sub-D/A converter 3a is stored in the first capacitor C11. As a result, the remaining charge obtained by subtracting the charge amount existing in the first capacitor C11 from the charge stored in the first capacitor C11 during the sampling period is shifted to the second capacitor C12.

In the series of operations described above, by adjusting the capacitance ratio between the first and second capacitors C11 and C12, the input signal voltage VIN can be subjected to amplification and addition/subtraction with an arbitrary scaling factor, and thus a desired input/output transmission function can be obtained.

In a pipeline A/D converter having a plurality of such A/D converter circuits 100 connected to one another, while one A/D converter circuit 100 is in the amplification period, the next-stage A/D converter circuit is in the sampling period, in which the output terminal of the preceding stage amplifier 1a is connected with the input terminal of the next-stage A/D converter circuit. Therefore, the output terminal of the preceding stage amplifier 1a is connected with the next-stage capacitor C13 including the next-stage sampling capacitors (first and second capacitors C11 and C12) and the like during the amplification period. With the next-stage capacitor C13 being connected, the A/D converter circuit is required to converge the output voltage to a predetermined operation target value. Therefore, since the load capacitance of the A/D converter circuit becomes very large, a high-performance amplifier 1a is necessary.

For the reason described above, to implement a high-resolution pipeline A/D converter operating at high speed, it is necessary to enhance the accuracy, gain and speed of the A/D converter circuit.

Non-Patent Literature 1: Andrew M. Abo et al., "A 1.5-V, 10-bit, 14.3-MS/s CMOS Pipeline Analog-to-Digital Converter", IEEE Journal of Solid-State Circuits, Vol. 34, No. 5, May 1999

DISCLOSURE OF THE INVENTION

Problems to be Solved by the Invention

In recent years, with the trends toward digitalization, higher speed and wider bands in signal processing and smaller sizes and lighter weights in information communication equipment, A/D converters, constituting an important analog block in digital signal processing, are required to operate at higher speed, in a wider band and with lower power consumption.

However, in the conventional A/D converter described above, once entering the amplification period, the A/D converter circuit 100 must converge the output voltage to a voltage of an amplification target value with high accuracy while having the next-stage capacitor C13 including capacitors for sampling and the like as its load. To perform such high-accuracy convergence, a very high-performance amplifier will be necessary, and this will also increase power consumption.

The next-stage A/D converter circuit enters the amplification period and the sampling period in the opposite phases to those for the preceding stage A/D converter circuit. Since the amplification target value in the amplification period of the A/D converter circuit has no correlation with the voltage value of the next-stage capacitor in the preceding clock phase, the charge amount and potential of the next-stage capacitor at the time immediately before the output terminal of the A/D converter circuit is connected with the next-stage capacitor after entering the amplification period are unknown. Therefore, the initial value of the output voltage of the A/D converter circuit observed at the moment of shifting to the amplification period cannot be uniquely determined, and thus the converging operation to the amplification target value may be delayed in some cases.

In view of the above problems, an object of the present invention is providing an A/D converter and an A/D conversion method, in which the initial value of the output voltage of an A/D converter circuit at the start of operational amplification is set to thereby speed up the convergence to a target value of the operational amplification and thus provide high-speed operation with low power consumption.

Means for Solving the Problems

To attain the above object, according to the present invention, a given bias voltage is applied to the next-stage capacitor before an A/D converter circuit enters the amplification period, to thereby set the initial value observed at the shifting of the A/D converter circuit to the amplification period. By this setting, the time required for the convergence to the operation target value in the operational amplification operation can be shortened, to enable high-speed operation of the A/D converter.

To state more specifically, the A/D converter of the present invention includes: an A/D converter circuit for A/D-converting an analog input signal received via an input terminal, then operationally amplifying an A/D-converted signal, and outputting an amplified signal from an output terminal; and an initial value setting circuit for providing an initial value for an output voltage at the start of amplification operation of the A/D converter circuit, wherein the initial value setting circuit supplies a given bias voltage to a next-stage capacitor to be connected with the output terminal of the A/D converter circuit at the start of amplification operation of the A/D converter circuit.

In the A/D converter described above, the A/D converter circuit may include: first and second capacitors; a sub-A/D converter for A/D-converting an analog input signal received via the input terminal; a sub-D/A converter for D/A-converting a digital input signal converted by the sub-A/D converter to generate a reference voltage; an amplifier for operationally amplifying the analog input signal based on the reference voltage generated by the sub-D/A converter and charge held in the first and second capacitors and outputting an amplified signal from the output terminal; and a switch group for switching connections among the first and second capacitors, the input terminal, the sub-D/A converter and the amplifier.

In the A/D converter described above, the initial value setting circuit may set the given bias voltage so that the initial value of the output voltage at the start of amplification operation of the A/D converter circuit is close to a target value of the operational amplification for the analog input signal.

In the A/D converter described above, the initial value setting circuit may include: a sub-A/D converter for A/D-converting the analog input signal; and a sub-D/A converter for generating a voltage previously made to correspond to a digital input signal converted by the sub-A/D converter and outputting the generated voltage as the given bias voltage.

In the A/D converter described above, the initial value setting circuit may include: a sub-D/A converter for generating a voltage previously made to correspond to a digital input signal converted by the sub-A/D converter of the A/D converter circuit and outputting the generated voltage as the given bias voltage.

The A/D conversion method of the present invention is an A/D conversion method for A/D-converting an analog input signal received via an input terminal, then operationally amplifying an A/D-converted signal with an A/D converter circuit, and outputting an amplified signal from an output terminal. The method includes the steps of:

A/D-converting and sampling the analog input signal during a sampling period; generating a given bias voltage corresponding to a digital input signal obtained during the sampling period and applying the given bias voltage to a next-stage capacitor to be connected with the output terminal of the A/D converter circuit, during an initial value setting period; and connecting the next-stage capacitor applied with the given bias voltage with the output terminal of the A/D converter circuit during an amplification period to operationally amplify the analog input signal with the A/D converter circuit.

In the A/D conversion method described above, the initial value setting period may be set between the sampling period and the amplification period.

In the A/D conversion method described above, the initial value setting period may be started after the analog input signal has been A/D-converted.

As described above, in the A/D converter and the A/D conversion method of the present invention, the initial value setting period is provided before the operational amplification period, and during the initial value setting period, a given bias voltage is supplied to the next-stage capacitor to be connected with the output terminal of the A/D converter circuit. As a result, at the time of shifting to the amplification period, the operational amplification operation by the A/D converter circuit is converged toward the target value from the initial value that is the given bias voltage. By appropriately setting the given bias voltage, therefore, the convergence to the target value of operational amplification is sped up.

In particular, according to the present invention, the given bias voltage supplied to the next-stage capacitor, that is, the initial value of the output voltage of the A/D converter circuit at the start of given operational amplification is set at a value close to the target value of the given operational amplification during the amplification period. Therefore, the convergence in the operational amplification operation can be further sped up, and thus a high-speed, low-power A/D converter can be implemented. By using such an A/D converter at each stage of a pipeline A/D converter, power reduction and speedup of the entire pipeline A/D converter can be attained.

EFFECT OF THE INVENTION

As described above, in the A/D converter and the A/D conversion method of the present invention, convergence to a target value of operational amplification in the operational amplification operation by the A/D converter circuit can be sped up. Therefore, a high-speed, low-power A/D converter can be implemented.

BRIEF DESCRIPTION OF THE INVENTION

DESCRIPTION OF REFERENCE NUMERALS

Figure 1:
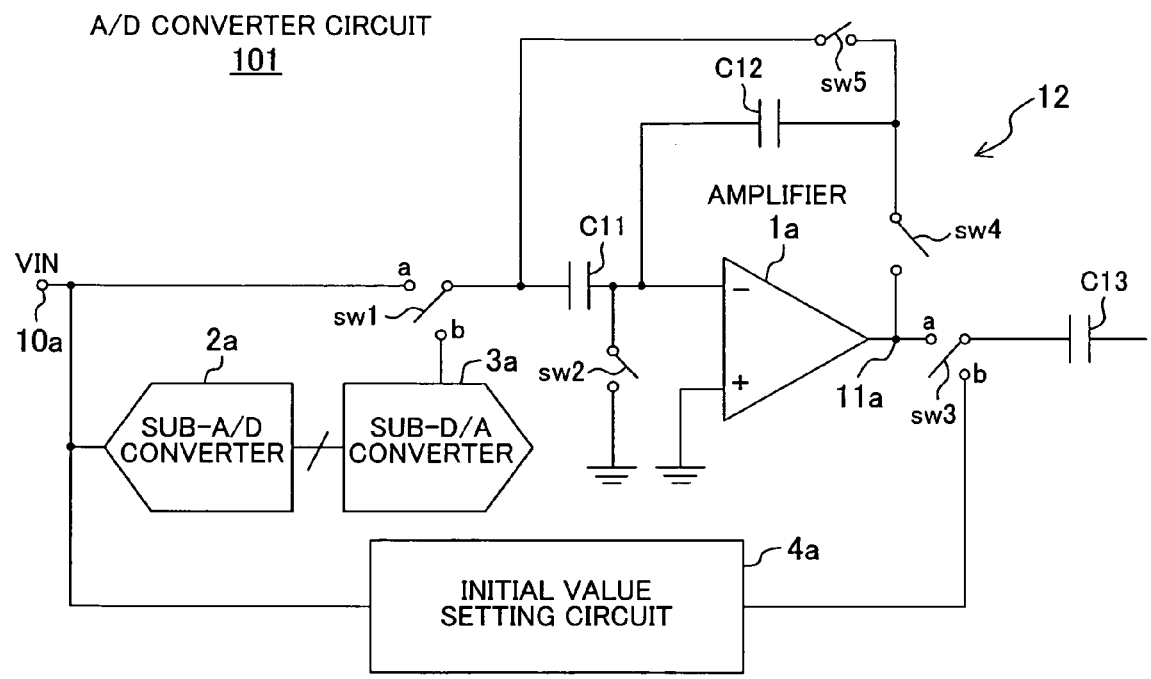
FIG. 1 is a block diagram of an A/D converter of Embodiment 1 of the present invention.

101, 102 A/D converter circuit
1a Amplifier
2a Sub-A/D converter
3a Sub-D/A converter
4a, 5a Initial value setting circuit
C11 First capacitor
C12 Second capacitor
C13 next-stage capacitor
SW1 to SW5 Switches
1d, 2d Voltage comparator
3d Second sub-A/D converter
4d Second sub-D/A converter
r1 to r3 Resistances
10a Input terminal
11a Output terminal
12 Switch group

BEST MODE FOR CARRYING OUT THE INVENTION

Hereinafter, A/D converters of embodiments of the present invention will be described with reference to the relevant drawings.

Embodiment 1

FIG. 1 is a block diagram of an A/D converter of Embodiment 1 of the present invention.

In an A/D converter circuit 101 shown in FIG. 1, the reference numeral 1a denotes an amplifier used in operational amplification of an input signal VIN received via an input terminal 10a, which outputs an operationally-amplified digital signal from an output terminal 11a. The reference numeral 2a denotes a sub-A/D converter for A/D-converting the input signal VIN received via the input terminal 10a, and 3a denotes a sub-D/A converter for D/A-converting a digital input signal A/D-converted by the sub-A/D converter 2a to determine a reference voltage used for addition/subtraction in the next amplification period. The reference numerals C11 and C12 denote first and second capacitors, and 12 denotes a switch group composed of five switches SW1, SW2, SW3, SW4 and SW5. The switch group 12 is for switching the connections among the first and second capacitors C11 and C12, the input terminal 10a, the sub-D/A converter 3a and the amplifier 1a.

The reference numeral 4a denotes an initial value setting circuit characteristic of the present invention, which sets the initial value of the output voltage of the A/D converter circuit 101 observed at the start of operational amplification. The internal configuration of this circuit will be described later.

Figure 2:
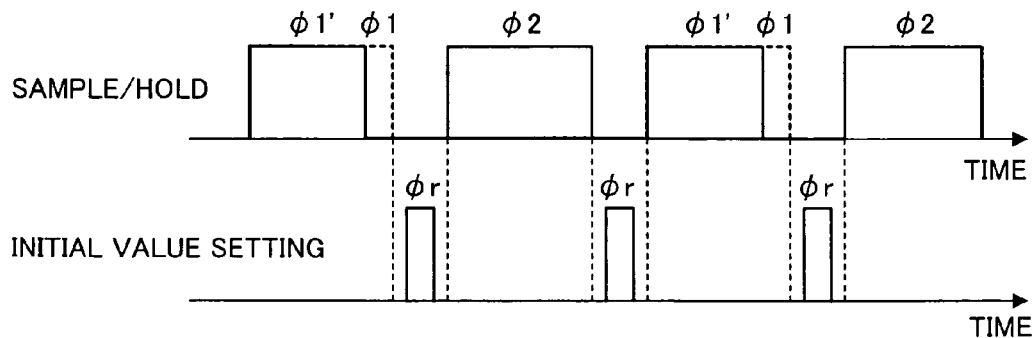
FIG. 2 is an operation timing chart of the A/D converter.

The circuit operation of the A/D converter circuit 101 in FIG. 1 will be described. FIG. 2 shows an exemplary timing chart of sampling periods $\phi 1$ and $\phi 1'$ ($\phi 1 \geq \phi 1'$), an amplification period $\phi 2$ and an initial value setting period $\phi r$ observed when the A/D converter circuit 101 in FIG. 1 is operated.

First, the sampling periods $\phi 1$ and $\phi 1'$ will be described. In the sampling periods $\phi 1$ and $\phi 1'$ the switch SW1 is switched to position a (the side of the input terminal 10a), two switches SW2 and SW5 are turned ON, the switch SW3 is put in an open state, and the switch SW4 is turned OFF. In this state, the analog input signal VIN, received via the input terminal 10a as the input signal to the A/D converter circuit 101, is applied to the first and second capacitors C11 and C12 and sampled.

The sampling period $\phi 1'$ is then terminated, turning OFF the switch SW2. Thereafter, the sampling $\phi 1$ is terminated, putting the switch SW1 in an open state and turning OFF the switch SW5. As a result, charge corresponding to the potential difference between the analog input signal VIN and the ground potential is stored in the capacitors C11 and C12.

The reason why the sampling period $\phi 1'$ is terminated earlier than the sampling period $\phi 1$ in the timing chart of FIG. 2 is to remove a variation in operation results that may occur due to charge injection at the time of switching of the switch SW2 from ON to OFF. If no problem arises from the standpoint of accuracy, the sampling periods $\phi 1$ and $\phi 1'$ may be terminated simultaneously.

The initial value setting period $\phi r$ will then be described. As shown in the timing chart of FIG. 2, the initial value setting period $\phi r$ is provided utilizing the non-overlap period existing between the sampling period and the amplification period in the conventional operational amplification operation. By this use of the non-overlap period, the initial value setting period $\phi r$ can be provided without the necessity of newly generating a clock phase. If the A/D conversion of the sub-A/D converter 2a is terminated midway through the sampling period, for example, the initial value setting period $\phi r$ may be provided in synchronization with the termination of the A/D conversion.

In the initial value setting period $\phi r$, the switch SW3 is switched to position b (the side of the initial value setting circuit 5a), to allow connection of the output terminal of the initial value setting circuit 4a with the next-stage capacitor C13. With this connection, during the initial value setting period $\phi r$, the initial value setting circuit 4a applies a given bias voltage corresponding to the analog input signal VIN to the next-stage capacitor C13, as will be described later. In a pipeline A/D conversion scheme, a given A/D converter circuit is followed by a similar A/D converter circuit and sub-A/D converter. The next-stage capacitor C13 represents the sum of capacitors including sampling capacitors of such components.

The amplification period $\phi 2$ will then be described. In the amplification period $\phi 2$, the switch SW1 is switched to position b (the side of the sub-D/A converter 3a), the switch SW3 is put in an open state, the switch SW4 is turned ON, and the switches SW2 and SW5 are turned OFF. In this state, the capacitor C11 is connected with the output side of the sub-D/A converter 3a, and the capacitor C12 is connected with the output side of the amplifier 1a (i.e., output terminal 11a). Since the charge stored in the capacitors C11 and C12 during the sampling periods $\phi 1$ and $\phi 1'$ is kept stored, the output voltage at the output terminal 11a of the A/D converter circuit 101 is converged toward an operation target value Vout expressed by the following equation.

$$V\text{out} = (C12+C11)/C12 \times V\text{IN} - C11/C12 \times V\text{DAC}$$

where VIN denotes the analog input signal voltage and VDAC denotes the output voltage of the sub-D/A converter 3a.

In the converging operation of the output voltage of the A/D converter circuit 101 during the amplification period φ2, the initial value of the output voltage is determined by the charge already stored in the first and second capacitors C11 and C12 and the next-stage capacitor C13. This indicates that by previously applying a given bias voltage to the next-stage capacitor C13 during the initial value setting period φr, the initial value for the converging operation during the amplification period φ2 can be made variable.

In the A/D converter circuit 101 of a pipeline A/D converter, there exists a unique transmission function of the output voltage with respect to the analog input signal voltage VIN. Therefore, once the voltage level of the analog input signal VIN is decided by the sub-A/D converter 2a, the target value of the operational amplification is finalized at this moment. In general, the A/D conversion of the sub-A/D converter 2a and the D/A conversion of the sub-D/A converter 3a have been terminated by the time of termination of the sampling periods φ1 and φ1', and thus the target value of the operational amplification in the amplification period φ2 has been finalized. Therefore, the given bias voltage for initial value setting may be set by the initial value setting circuit 4a so that the initial value of the output voltage of the A/D converter circuit 101 in the amplification period φ2 will be close to this target value of the operational amplification. This will be described in detail later.

In the conventional example described earlier, it is necessary to converge the output voltage of the A/D converter circuit from 0 V to the maximum target voltage value of operational amplification if the amplitude is maximum, for example. In this embodiment, however, the initial value of the output voltage of the A/D converter circuit 101 in the amplification period φ2 is set. That is, the initial value for the converging operation to the target value in the amplification period φ2 is set in advance at a value close to the target value of operational amplification. Therefore, it is unnecessary to converge the output voltage of the A/D converter circuit 101 from 0 V to the target value of operational amplification even if the amplitude is maximum, but only necessary to start the converging operation from a value close to the target value of operational amplification. Thus, since the voltage width to be converged can be reduced in the operational amplification operation, the convergence of the output voltage of the A/D converter circuit 101 can be sped up.

When the A/D converter circuit shifts to the amplification period φ2, the next-stage A/D converter circuit terminates its amplification period. The operational amplification results of the next-stage A/D converter circuit are for the immediately preceding analog input signal VIN, and thus are not related with the target value of operational amplification at the preceding stage. Therefore, the charge amount of the next-stage capacitor C13 stored during the previous amplification period has no correlation with the charge amount during the amplification period in the next phase. Thus, the initial value of the output voltage of the A/D converter circuit 101 at the moment of connection with the capacitors C11 and C12 of the A/D converter circuit 101 depends also on the immediately preceding analog input signal VIN. Conventionally, the initial value of the output voltage in operational amplification operation by the A/D converter circuit 101 is found to be even a value opposite in polarity to the target value of operational amplification in the worst case, and this causes increase of the voltage amplitude required for convergence and thus delay in converging operation. In this embodiment, in which the initial value of the output voltage in the operational amplification operation by the A/D converter circuit 101 is set, the converging operation can be sped up.

Figure 3:
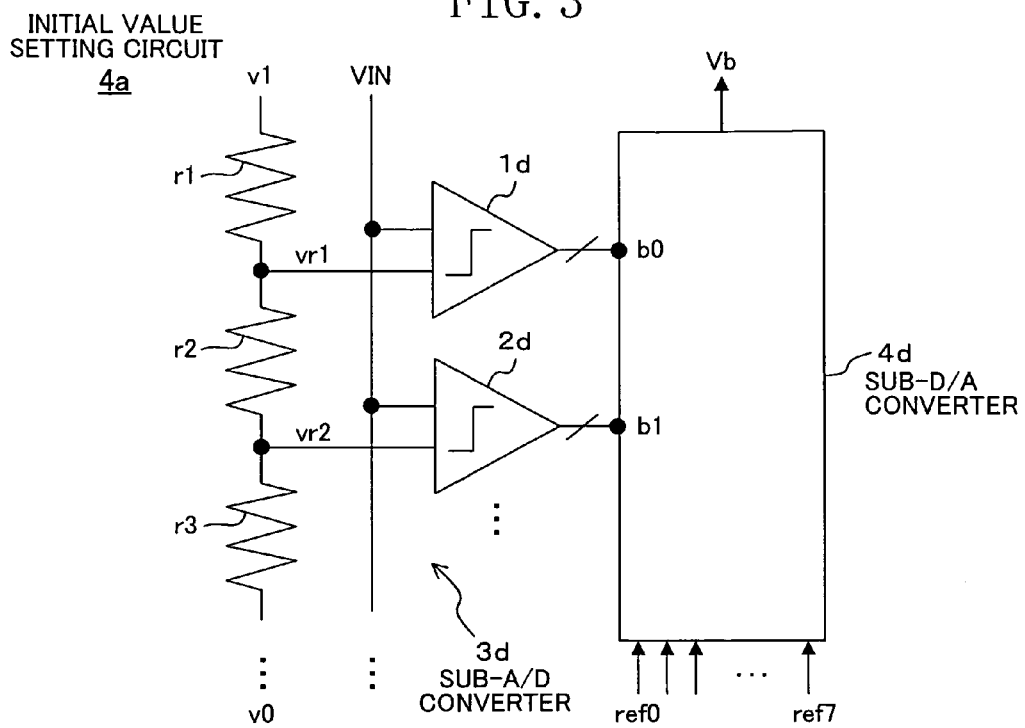
FIG. 3 is a circuit diagram showing an internal configuration of an initial value setting circuit in the A/D converter.

An exemplary configuration of the initial value setting circuit 4a is shown in FIG. 3. In FIG. 3, the initial value setting circuit 4a is essentially composed of a flash type second sub-A/D converter 3d having a plurality of voltage comparators 1d, 2d, ... and a plurality of resistances r1, r2, r3, ... and a second sub-D/A converter 4d for D/A-converting output signals b0, b1, ... of the sub-A/D converter 3d to a given bias voltage Vb for initial value setting.

The voltage comparators 1d, 2d, ... respectively compare voltages vr1, vr2, ..., obtained by dividing the voltage between two predetermined reference voltages v1 and v0 with the plurality of resistances r1, r2, r3, ..., with the analog input voltage VIN, to thereby perform A/D conversion of the analog input voltage VIN and thus decide the input signal level. The sub-D/A converter 4d receives a combination of the output voltages b0, b1, ... of the voltage comparators 1d, 2d, .... The sub-D/A converter 4d also holds given bias voltages ref0 to ref7 for initial value setting corresponding to the respective combinations of the output voltages b0, b1, ..., selects one of the given bias voltages ref0 to ref7 for initial value setting that corresponds to the combination of the output voltages b0, b1, ... received from the voltage comparators 1d, 2d, ..., and generates and outputs the selected bias voltage for initial value setting. The given bias voltages ref0 to ref7 for initial value setting are set at voltage values (Vtgt0±ΔV) to (Vtgt7±ΔV) each obtained by adding or subtracting a predetermined minute voltage value ΔV to or from the target value Vtgt of operational amplification for the corresponding analog input signal voltage VIN when this analog input signal voltage VIN is inputted.

Assuming herein that a 3-bit sub-A/D converter 3d is used for the initial value setting, the sub-A/D converter 3d is essentially composed of seven voltage comparators 1d, ... and eight resistances r1, .... To correspond to these components, given bias voltage values ref0, ... of the number equivalent to three bits are required. In a normal 1.5-bit/stage bit/stage type pipeline A/D conversion scheme, in which a plurality of analog input voltages VIN correspond to one operational amplification result value, it is unnecessary to provide the 3-bit equivalent number of given bias voltage values for initial value setting.

By enhancing the conversion accuracy of the sub-A/D converter 3d and the sub-D/A converter 4d of the initial value setting circuit 4a, the error between the set initial value and the target value of the operational amplification decreases, and thus the convergence to the operation target value in the operational amplification operation is sped up.

With the configuration described above, in this embodiment, the sub-A/D converter 3d of the initial value setting circuit 4a decides the voltage level of the analog input signal VIN, and then the sub-D/A converter 4d thereof D/A-converts the voltage level to a given bias voltage Vb that is close to the target value of operational amplification. The given bias voltage Vb is then supplied to the next-stage capacitor C13, to thereby set the initial value of the output voltage in the operational amplification operation by the A/D converter circuit 101. In this way, the convergence to the target value of operational amplification can be sped up, and thus system speedup of the entire A/D converter can be achieved.

Embodiment 2

Next, an A/D converter of Embodiment 2 will be described.

In Embodiment 1, the initial value setting circuit 4a includes the sub-A/D converter 3d as shown in FIG. 3. In this embodiment, the sub-A/D converter 2a of the A/D converter circuit also serves as a substitute for the sub-A/D converter 3d.

Figure 4:
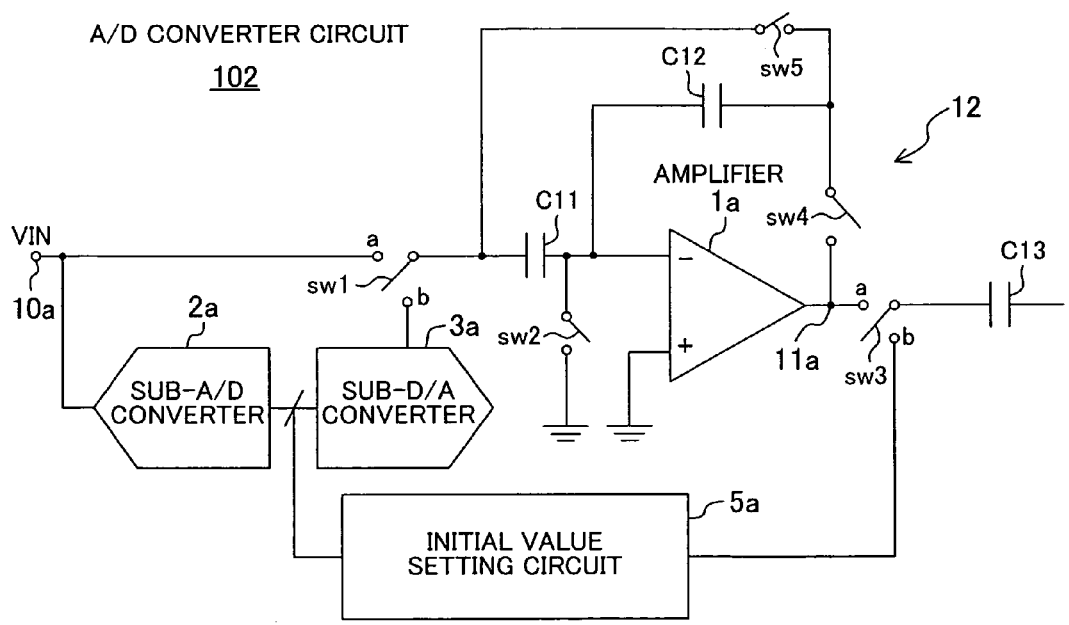
FIG. 4 is a block diagram of an A/D converter of Embodiment 2 of the present invention.

FIG. 4 is a block diagram of the A/D converter of Embodiment 2 of the present invention.

In an A/D converter circuit 102 shown in FIG. 4, the reference numeral 5a denotes an initial value setting circuit for setting the initial value of the output voltage in the operational amplification by the A/D converter circuit 102. The initial value setting circuit 5a receives digital input signals from the sub-A/D converter 2a that A/D-converts the analog input signal VIN to decide the voltage level of the analog input signal VIN. Therefore, the initial value setting circuit 5a, which is different from the initial value setting circuit 4a shown in FIG. 3 in that the sub-A/D converter 3a is not provided, receives the digital input signals from the sub-A/D converter 2a and D/A-converts the received signals to a given bias voltage Vb in the sub-D/A converter 4d (see FIG. 3). Note that in FIG. 4, the same components as those in FIG. 1 are denoted by the same reference numerals, and the description thereof is omitted in this embodiment.

Thus, in this embodiment, in which the sub-A/D converter 3d is not provided, the number of sub-A/D converters can be reduced, compared with Embodiment 1. Note that in Embodiment 1, the degree of accuracy and the voltage for decision can be arbitrarily selected for each of the sub-A/D converter 2a for operational amplification and the sub-A/D converter 3d in the initial value setting circuit 4a. In this embodiment, however, the accuracy of the initial value setting will be determined simultaneously with the accuracy of the A/D conversion at each operational amplification stage, that is, the resolution of the sub-A/D converter 2a.

With the configuration described above, in this embodiment, the sub-A/D converter 2a decides the voltage level of the analog input signal VIN, and then the sub-D/A converter 4d of the initial value setting circuit 4a performs D/A conversion to obtain a given bias voltage Vb that is close to the target value in the operational amplification operation. The given bias voltage Vb is supplied to the next-stage capacitor C13, to thereby set the initial value of the output voltage in the operational amplification operation by the A/D converter circuit 102. In this way, the convergence to the target value in the operational amplification operation can be sped up, and thus system speedup of the entire A/D converter can be achieved.

Embodiment 3

An A/D converter of Embodiment 3 of the present invention will be described.

In Embodiment 1, the initial value setting period φr was provided between the sampling periods φ1 and φ1' and the amplification period φ2. In this embodiment, the initial value setting period φr is set to start at the time point of termination of the decision of the voltage level in the sub-A/D converter 3d or 2a.

In this embodiment, the circuit configurations in Embodiments 1 and 2 can be used. Hereinafter, the operation will be described using the circuit configuration in Embodiment 2.

Figure 5:
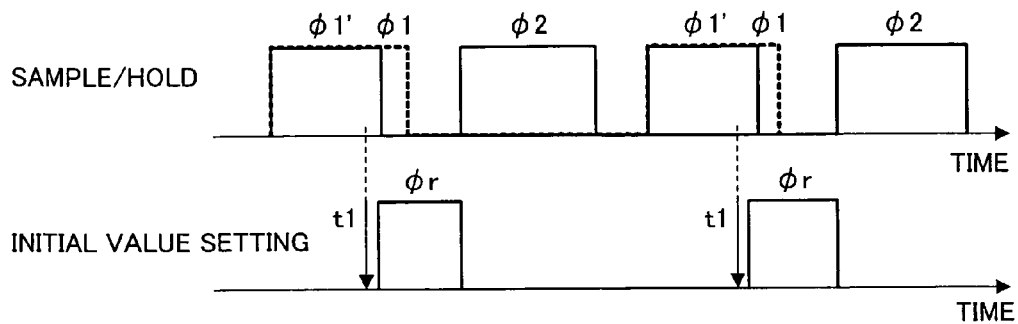
FIG. 5 is an operation timing chart of an A/D converter of Embodiment 3.
Figure 6:
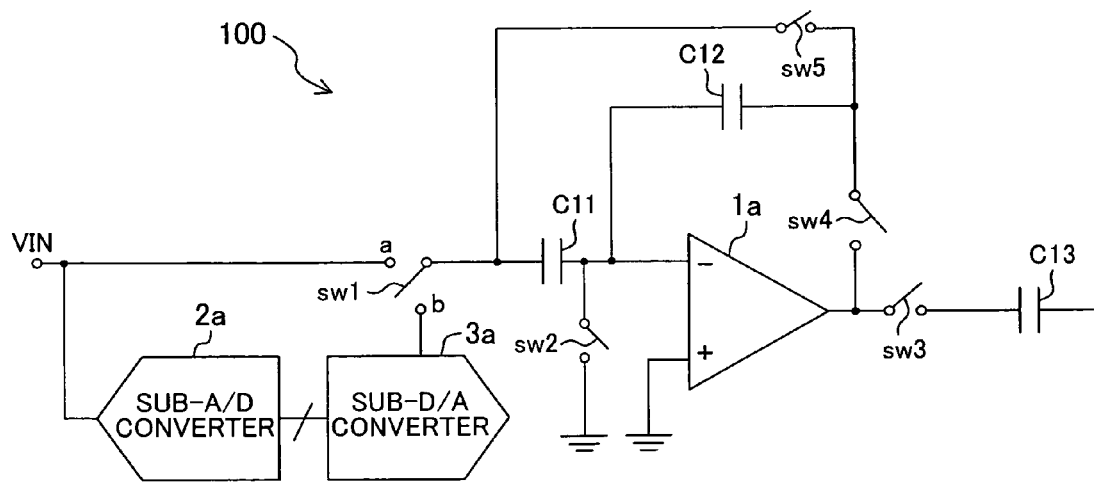
FIG. 6 is a block diagram of a conventional A/D converter.

In the timing chart of FIG. 5, φ1 and φ1' denote sampling periods and φ2 denotes an amplification period. Time t1 represents the time at which A/D conversion by the sub-A/D converter 2a is terminated. The target value of operational amplification by the A/D converter circuit 102 must have been finalized at this time, and thus at and after this time, shifting to the initial value setting period φr is possible. In FIG. 5, shifting to the initial value setting period φr is made after the timing t1 of termination of the A/D conversion by the sub-A/D converter 2a. The sampling periods φ1 and φ1' are then terminated to shift to the amplification period φ2. The initial value setting period φr may continue during this time.

In the initial value setting period φr, the A/D conversion results from the sub-A/D converter 2a are D/A-converted to a given bias voltage Vb. In the illustrated example, the initial value setting period φr is terminated before start of the amplification period φ2. Alternatively, the initial value setting period φr may be made to continue after the shift to the amplification period φ2 temporarily, so that the state in which the given bias voltage Vb for initial value setting is supplied to the output terminal 11a of the amplifier 1a and the next-stage capacitor C13 may be maintained. Such a state of the output terminal 11a of the amplifier 1a being supplied with the given bias voltage Vb for initial value setting will not affect the operational amplification results, because the total amount of charge applied during the sampling periods φ1 and φ1' and held in the capacitors C11 and C12 is kept stored therein since the input side of the amplifier 1a is floated with the switch SW1 being open.

With the configuration described above, when the voltage level of the analog input signal VIN is decided before termination of the sampling periods φ1 and φ1', the sub-D/A converter 4d performs the D/A conversion to give a given bias voltage Vb close to the target value of the output voltage in operational amplification after this decision. Using the given bias voltage Vb, the initial value of the output voltage in the operational amplification operation by the A/D converter circuit 102 is set. In this way, the convergence to the target value of the operational amplification can be sped up, and thus system speedup of the entire A/D converter can be achieved.

INDUSTRIAL APPLICABILITY

As described above, according to the present invention, convergence to a target value of operational amplification in the operational amplification operation by an A/D converter circuit provided in an A/D converter can be sped up. Therefore, in pipeline A/D converters having such an A/D converter at each stage, higher speed and lower power consumption can be attained. Thus, the present invention is useful for uses of pipeline A/D converters, such as uses of video signal processing in TV sets and video recorders and communication signal processing in wireless LAN and the like, for example.

The invention claimed is:

1. An A/D converter comprising:
   an A/D converter circuit for A/D-converting an analog input signal received via an input terminal, then operationally amplifying the A/D-converted signal, and outputting the amplified signal from an output terminal; and
   an initial value setting circuit for providing an initial value for an output voltage at the start of amplification operation of the A/D converter circuit,
   wherein the initial value setting circuit supplies a given bias voltage corresponding to the analog input signal to a next-stage capacitor to be connected with the output terminal of the A/D converter circuit at the start of amplification operation of the A/D converter circuit.

2. The A/D converter of claim 1, wherein the A/D converter circuit comprises:
   first and second capacitors;
   a sub-A/D converter for MD-converting the analog input signal received via the input terminal;
   a sub-D/A converter for D/A-converting the digital input signal converted by the sub-A/D converter to generate a reference voltage;

an amplifier for operationally amplifying the analog input signal based on the reference voltage generated by the sub-D/A converter and charge held in the first and second capacitors and outputting the amplified signal from the output terminal; and a switch group for switching connections among the first and second capacitors, the input terminal, the sub-D/A converter and the amplifier.

3. The A/D converter of claim 1, wherein the initial value setting circuit sets the given bias voltage so that the initial value of the output voltage at the start of amplification operation of the A/D converter circuit is close to a target value of the operational amplification for the analog input signal.

4. The A/D converter of claim 1, wherein the initial value setting circuit comprises:

a sub-A/D converter for A/D-converting the analog input signal; and a sub-D/A converter for generating a voltage previously made to correspond to the digital input signal converted by the sub-A/D converter and outputting the generated voltage as the given bias voltage.

5. The A/D converter of claim 2, wherein the initial value setting circuit comprises:

a sub-D/A converter for generating a voltage previously made to correspond to the digital input signal converted by the sub-A/D converter of the A/D converter circuit and outputting the generated voltage as the given bias voltage.

6. An A/D conversion method for A/D-converting an analog input signal received via an input terminal, then operationally amplifying the A/D-converted signal with an A/D converter circuit, and outputting the amplified signal from an output terminal, comprising the steps of:

A/D-converting and sampling the analog input signal during a sampling period;

generating a given bias voltage corresponding to the digital input signal obtained during the sampling period and applying the given bias voltage to a next-stage capacitor to be connected with the output terminal of the A/D converter circuit, during an initial value setting period; and connecting the next-stage capacitor applied with the given bias voltage with the output terminal of the A/D converter circuit during an amplification period to operationally amplify the analog input signal with the A/D converter circuit.

7. The A/D conversion method of claim 6, wherein the initial value setting period is set between the sampling period and the amplification period.

8. The A/D conversion method of claim 6, wherein the initial value setting period is started after the analog input signal has been A/D-converted.

* * * * *